(12) United States Patent
Inoue et al.

(10) Patent No.: US 6,340,542 B1
(45) Date of Patent: Jan. 22, 2002

(54) METHOD OF MANUFACTURING A SEMICONDUCTOR DEVICE, METHOD OF MANUFACTURING A PHOTOMASK, AND A MASTER MASK

(75) Inventors: Soichi Inoue; Suigen Kyoh, both of Yokohama; Iwao Higashikawa, Tokyo; Ichiro Mori, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/455,320

(22) Filed: Dec. 6, 1999

(30) Foreign Application Priority Data

Dec. 8, 1998 (JP) ............................................ 10-348623

(51) Int. Cl.$^7$ ............................ G03F 9/00; G06F 17/50
(52) U.S. Cl. ........................................ 430/5; 716/21
(58) Field of Search ........................ 430/5, 311, 322, 430/30; 716/19, 21

(56) References Cited

U.S. PATENT DOCUMENTS

| | | | |
|---|---|---|---|
| 4,748,478 A | 5/1988 | Suwa et al. | 355/53 |
| 5,682,323 A | 10/1997 | Pasch et al. | 364/491 |
| 6,040,892 A | * 3/2000 | Pierrat | 430/5 |
| 6,200,710 B1 | * 3/2001 | Hada | 430/5 |

FOREIGN PATENT DOCUMENTS

| | | |
|---|---|---|
| JP | 2593440 | 12/1996 |
| JP | 2715937 | 11/1997 |
| JP | 10-90874 | 4/1998 |

* cited by examiner

*Primary Examiner*—S. Rosasco
(74) *Attorney, Agent, or Firm*—Finnegan, Henderson, Farabow, Garrett, & Dunner, L.L.P.

(57) ABSTRACT

A method of manufacturing a semiconductor device, light is applied through the cell patterns made in master masks, thereby transferring the cell patterns to, and forming the cell patterns on, a wafer. On the basis of layout data representing a layout diagram of the semiconductor device, the pattern data of the device is divided along the boundaries of the function blocks of the device, generating pattern data items. Master masks are prepared in accordance with the pattern data items. Light is applied to the wafer, first through the master mask and then through the master mask. The cell patterns made in the master masks are transferred to the wafer.

15 Claims, 16 Drawing Sheets

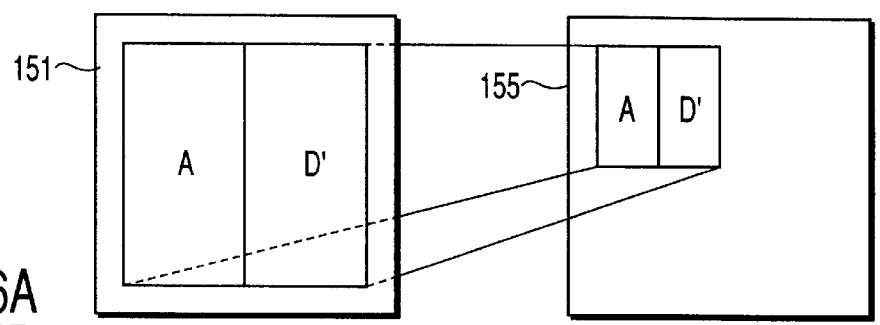
FIG. 6A
PRIOR ART
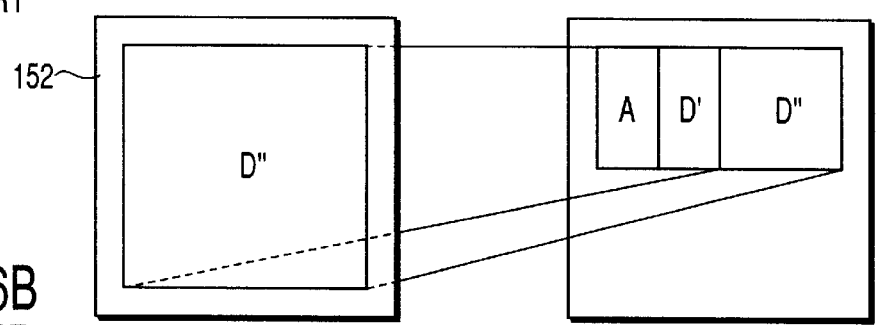
FIG. 6B
PRIOR ART
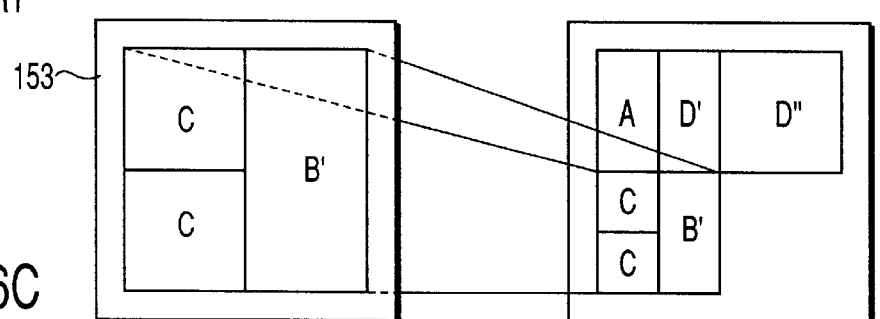
FIG. 6C
PRIOR ART
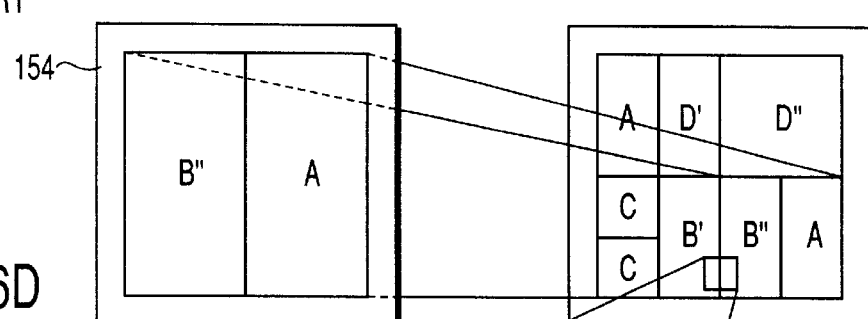
FIG. 6D
PRIOR ART
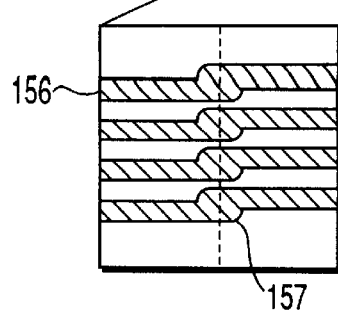

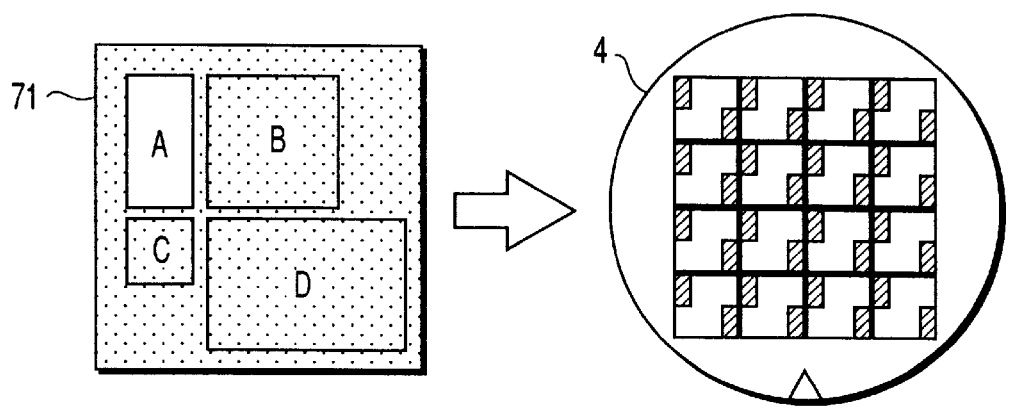
FIG. 15A
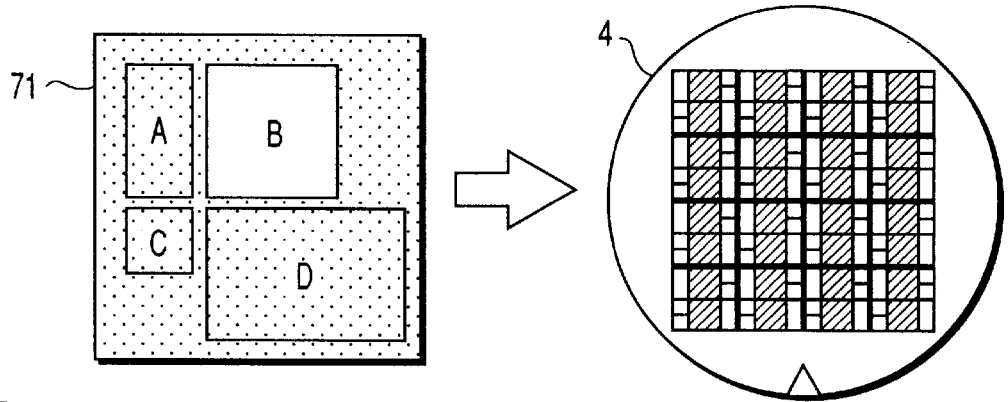
FIG. 15B
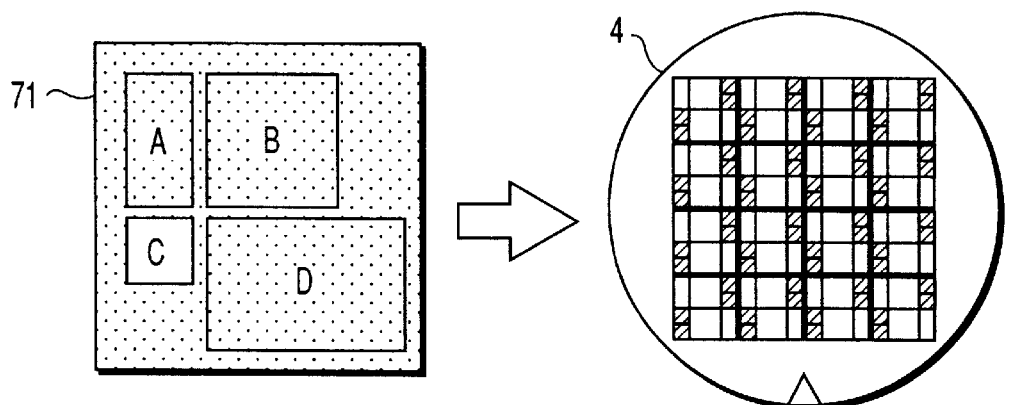
FIG. 15C
FIG. 15D

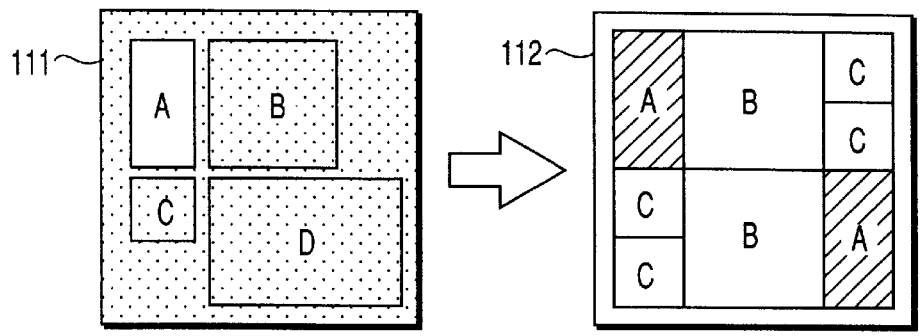
FIG. 17A
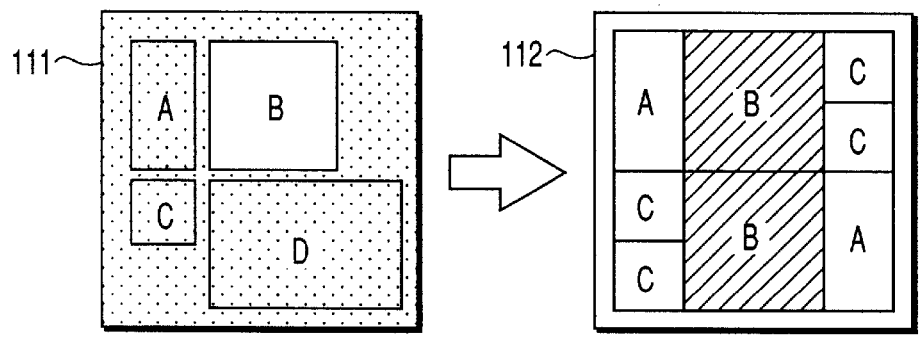
FIG. 17B
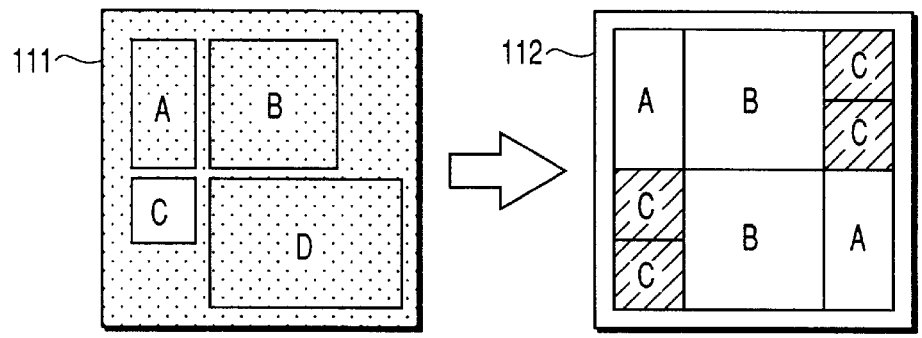
FIG. 17C
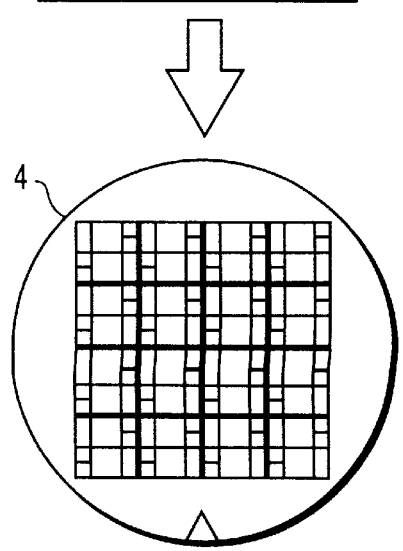

METHOD OF MANUFACTURING A SEMICONDUCTOR DEVICE, METHOD OF MANUFACTURING A PHOTOMASK, AND A MASTER MASK

BACKGROUND OF THE INVENTION

The present invention relates to a method of manufacturing a semiconductor device, a photomask, and a master mask. More particularly, the invention relates to a method of transferring the pattern of a master mask to a substrate or a photomask by means of a projection-type exposure apparatus.

FIG. 1 shows the sequence of manufacturing a conventional logic device. More precisely, FIG. 1 shows the sequence of designing and manufacturing a system LSI. At first, the design specification is prepared in Step 111 in accordance with requests made by the customer. In Step 112, a Register Transfer Level (RTL), which is a kind of a Hardware Description Language (HDL), is prepared on the basis of the design specification. In Steps 113 and 114, the RTL is converted to a circuit diagram by using a logic synthesis tool. In Steps 115 and 116, a Placement and Routing (P&R) tool is used, thereby preparing a layout diagram.

The layout of function blocks, known as standard cells, macro cells, and IP blocks, is designed for the layers located below the wiring layer. Then, the data representing this layout is generated in the form of an information library. In accordance with the information library, the cells corresponding to the function blocks of circuit diagrams are automatically arranged by the placement and routing function of the P&R tool. In the wiring layer, cells are arranged to work in compliance with cells arranged in lower layers. These cells are automatically prepared by using the placement and routing function in accordance with the circuit diagrams.

A one-chip LSI layout diagram is thus prepared. In Step 117, the LSI layout diagram is subjected to Process Proximity Correction (PPC), which is performed by using data conversion software, and is then converted to mask-writing data.

The components of the pattern may be made smaller, approaching the minimum size equivalent to the resolution of the exposure apparatus used. If so, each pattern component on the wafer will have its corners rounded during photolithography due to the optical proximity effect (OPE). Consequently, the pattern formed may not correlate to the desired pattern. For example, the end portions of each pattern component may become shorter than is designed. To make matters worse, the widths of pattern components may change in some cases due to micro-loading effect, after the mask layer or the wafer has been etched. The optical proximity effect and the micro-loading effect are generally called "PPE (Process Proximity Effect)." The technique of correcting the deformation of a pattern, caused by PPE, is known as "PPC."

In Step 118, a mask-writing tool draws a pattern on a substrate in accordance with the mask-writing data, thereby manufacturing a master mask. In Step 119, an exposure apparatus applies light to a wafer through the master mask. An LSI pattern is thereby formed on the wafer in Step 120.

As the integration density of an LSI pattern increases, the components of device patterns must have smaller sizes of higher precision. It is therefore necessary to form a larger master mask for each device pattern. Therefore, one master mask cannot alone represent the entire one-chip LSI pattern. That is, two or more master masks must be formed to represent a one-chip LSI pattern. FIG. 2 is a flow chart explaining a conventional method of manufacturing a semiconductor device, in which a plurality of master masks are used to form a one-chip LSI pattern. As shown in FIG. 2, the actual layout diagram of an LSI is prepared in Step 206. In Step 207, the layout diagram of the LSI pattern is converted to data, and the resultant data is divided into parts by the use of a chip-data cutting tool. The parts of the data thus provided will be used to prepare master masks that form a one-chip LSI pattern. The flow chart of FIG. 2, explaining the method of manufacturing an LSI, is basically the same as the flow chart of FIG. 1 but different in that the data representing the layout of the LSI is divided into, for example, two parts by using a chip-data cutting tool. FIGS. 3A and 3B are diagrams for explaining, in detail, a conventional method of manufacturing a semiconductor device.

Two master masks 131 and 132 are prepared on the basis of two pattern data items, respectively. Light is applied to a wafer 4 through first master mask 131. Shaded regions 133 of wafer 4 are thereby exposed to light as is illustrated in FIG. 3A. Next, light is applied to wafer 4 through the second master mask 132, whereby shaded regions 134 of wafer 4 are exposed to light as is shown in FIG. 3B. A product 1 is thereby made. Since the chip has been divided along a center line into two parts, the cell B is divided into two parts B' and B", and the cell D into two parts D' and D", as is illustrated in FIGS. 3A and 3B. Inevitably, the pattern in the cell B is cut into two parts, and the pattern in the cell D into two parts. Four butting portions of the pattern are therefore formed on the wafer 4. As shown in FIG. 3B, pattern components 135 (e.g., resist strips) on one part may not align with pattern components 125 (e.g., resist strips) of the other part at butting portion 136, as is illustrated in FIG. 3B. When each pattern component on one part is combined with the corresponding one on the other part, the resultant single pattern component has a size different from the designed one, inevitably deteriorating the precision of the resist pattern.

The problem with the butting portions of the pattern is prominent if an LSI pattern is formed by means of a mask-forming exposure apparatus (known as "photorepeater"). The mask-forming exposure apparatus projects a reduced image of a master mask on a mask layer. As shown in FIG. 4, the exposure apparatus comprises a projection optical system 142. Shown in FIG. 4 are a master mask 141 and a photomask 143. The projection optical system 142 is a ⅕-reduction system that has a 22×22 mm field at the photomask dimension. The reduction ratio of the system is set to ¼ to form a pattern on a wafer. Therefore, two or more master masks must be jointed together and light must be applied to the wafer through the master masks in order to form chips having a size of 5.5×5.5 mm or more on the wafer.

A method of manufacturing an LSI pattern, in which master masks are jointed together to expose a wafer to light through them, will be explained with reference to the flow chart of FIG. 5. This method differs from the method shown in the flow chart of FIG. 1 in that a photorepeater is used to form a photomask. The chip-cutting tool used in this method performs the same function as the tool used in the process shown in FIG. 3A. How the photomask is formed in this method will be described with reference to FIGS. 6A to 6D. Assume that the data representing the layout of a product named "product" 11 is divided into four data items. Using the four data items, four master masks 151 to 154 are prepared. Light is applied to a photoresist layer, first through the first master mask 151, then through the second master mask 152, next through the third master mask 154, and finally through the fourth master mask 154. As a result, a photomask 155 is formed. In this case, the chip is divided into four parts, along the vertical center line and the horizontal center line. Therefore, cell B is divided into two parts B' and B", and cell D into two parts D' and D". Inevitably, the pattern in the cell B is cut into two parts, and the pattern in the cell D into two parts. Butting portions of the pattern are therefore formed on the wafer. As shown in FIG. 6D, resist strips 156 forming one part of the pattern may not align with resist strips 156 forming the other part of the pattern, at butting portion 157, as is illustrated in FIG. 6D. When each resist strip on one part is combined with the corresponding one on the other part, the resultant single resist strip has but a size different from the designed one, inevitably deteriorating the precision of the resist pattern.

In the conventional method of manufacturing a semiconductor device or a photomask, the data representing the layout pattern of the product is divided into data items, no matter whether the patterns of the master masks are transferred by a projection-type exposure apparatus or a photorepeater. Since the data is so divided, without reference to the data showing the arrangement of standard cells, macro cells, IP blocks and the like, the pattern in a cell may be divided into parts in some cases. Consequently, the pattern components formed, on the cell parts are not aligned and each combined pattern component fails to have the desired design size at the butting portions.

BRIEF SUMMARY OF THE INVENTION

The present invention provides a method of manufacturing a semiconductor device, in which each pattern component is prevented from having a size different from the design size at the butting portions between its parts.

The invention provides a method of manufacturing a photomask, in which each pattern component is prevented from having a size different from the design size at the butting portions between its parts.

The invention provides a master mask in which each pattern component is prevented from having a size different from the design size at the butting portions between its parts.

The invention provides a method of manufacturing a semiconductor device comprising selecting at least one of function-unit patterns made in a master mask and arranged on the basis of layout data representing a layout diagram of the semiconductor device, and applying light through the selected function-unit pattern to a substrate, thereby transferring the selected function-unit pattern to the substrate and forming the selected function-unit pattern thereon at a prescribed position by means of photolithography.

The invention provides a method of manufacturing a photomask, comprising selecting at least one of function-unit patterns made in a master mask and arranged on the basis of layout data representing a layout diagram of the semiconductor device, and applying light through the selected function-unit pattern to a photomask layer, thereby transferring the selected function-unit pattern to the photomask layer and forming the selected function-unit pattern thereon at a prescribed position by means of photolithography.

The present invention provides a master mask designed to transfer a pattern and having function-unit patterns arranged on the basis of layout data representing a layout diagram of the semiconductor device.

Before transferring the function-unit pattern to a wafer by a projection-type exposure apparatus or to a photomask by a photorepeater, the pattern of the semiconductor device is divided into masks along the boundaries of the function blocks, on the basis of layout data representing a layout diagram of the semiconductor device. A plurality of master masks are thereby prepared and used, transferring function-unit patterns to the wafer or photomask. Therefore, each function-unit pattern is not divided at all, and the components of any function-unit pattern are not cut into parts. Thus, the pattern components do not change in size as does a pattern component composed of two or more parts jointed together.

The master mask has various function-unit patterns formed and arranged in accordance with the layout data that represents the layout diagram of the semiconductor device. Some of the function-unit patterns are selected. Light is applied through the selected patterns to a wafer or photomask layer. Hence, different products, each different in the actual layout from any other, can be manufactured by using only one master mask. Many master masks need not be prepared or used. This greatly reduces the manufacturing cost of preparing the master mask. The time required to prepare the master mask is saved, greatly shortening the time of manufacturing the LSIs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6D are diagrams explaining a method of manufacturing a custom LSI in which the mask-forming exposure apparatus shown in FIG. 4 is used;

FIGS. 15A to 15D are still other diagrams for explaining the method according to the third embodiment;

FIGS. 17A to 17C are diagrams for explaining a method of manufacturing a semiconductor device, which is the fifth embodiment of the present invention.

DETAILED DESCRIPTION OF THE INVENTION

Embodiments of the present invention will be described below, with reference to the accompanying drawings.

First Embodiment

A method of manufacturing a semiconductor device, according to the first embodiment of this invention, will be described with reference to FIGS. 7A to 7C, FIG. 8 and FIGS. 9A to 9C. The method is designed to minimize the change in size of each pattern component at the butting portions between the parts constituting the pattern component. A description of how a one-chip device is formed on a wafer by using two masks is provided, in the method according to the first embodiment.

Figure 1:
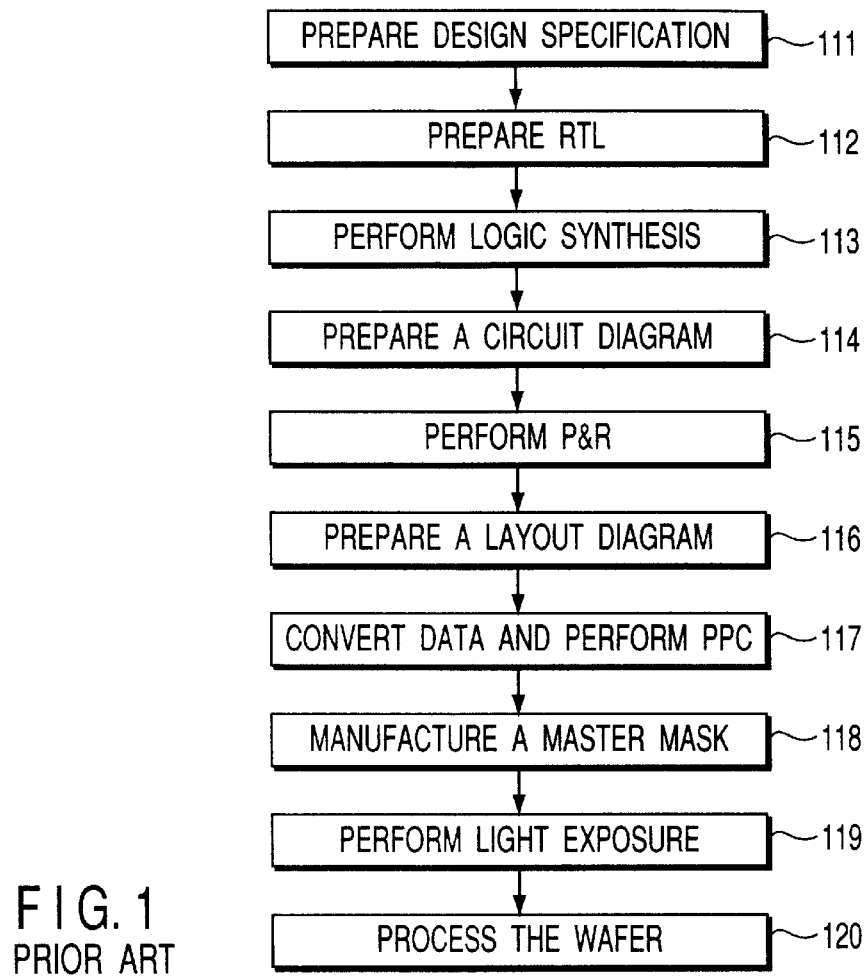
FIG. 1 is a flow chart explaining a conventional method of manufacturing a custom LSI.
Figure 4:
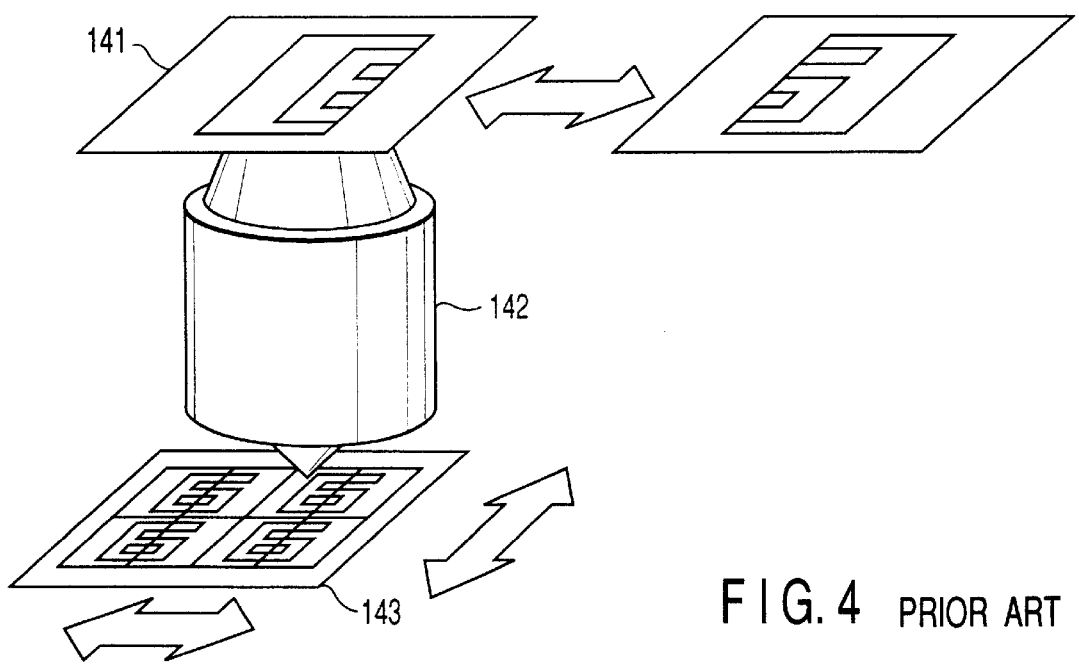
FIG. 4 is a perspective view showing a conventional mask-forming exposure apparatus (photorepeater)
Figure 2:
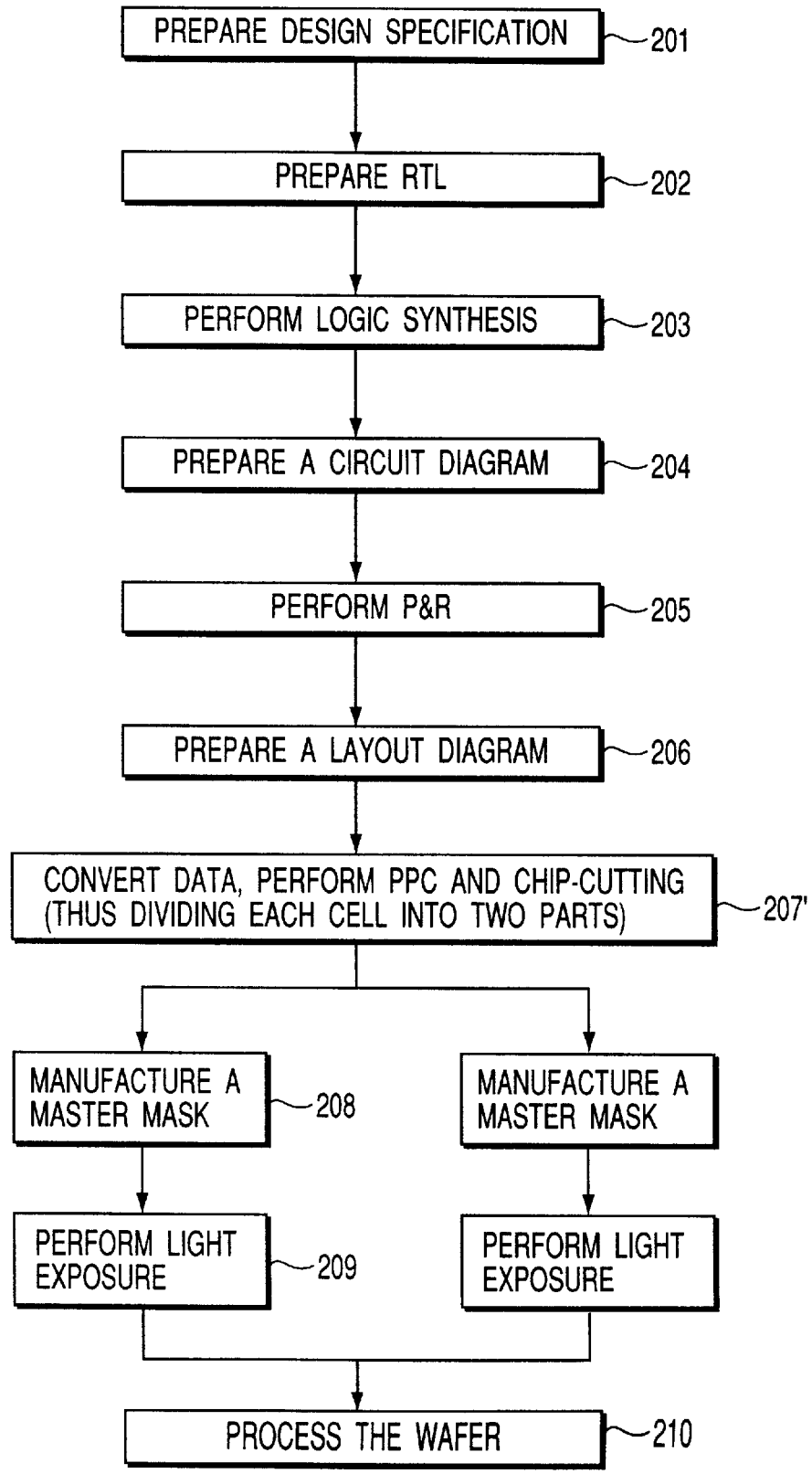
FIG. 2 is a flow chart explaining a conventional method of manufacturing a custom LSI, by using a plurality of master masks.
Figure 3A:
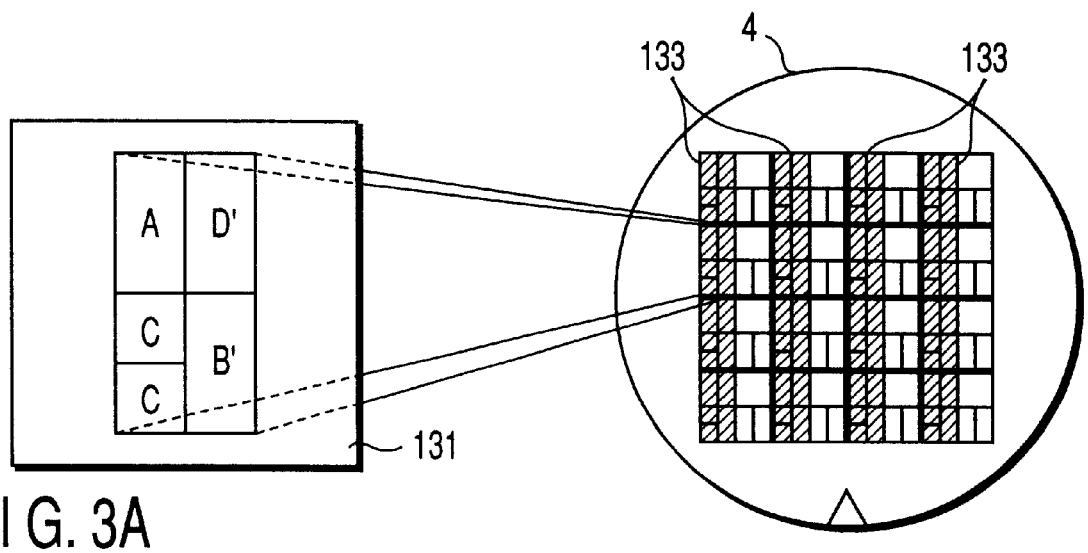
FIGS. 3A and 3B are diagrams explaining the conventional method of manufacturing a custom LSI.
Figure 3B:
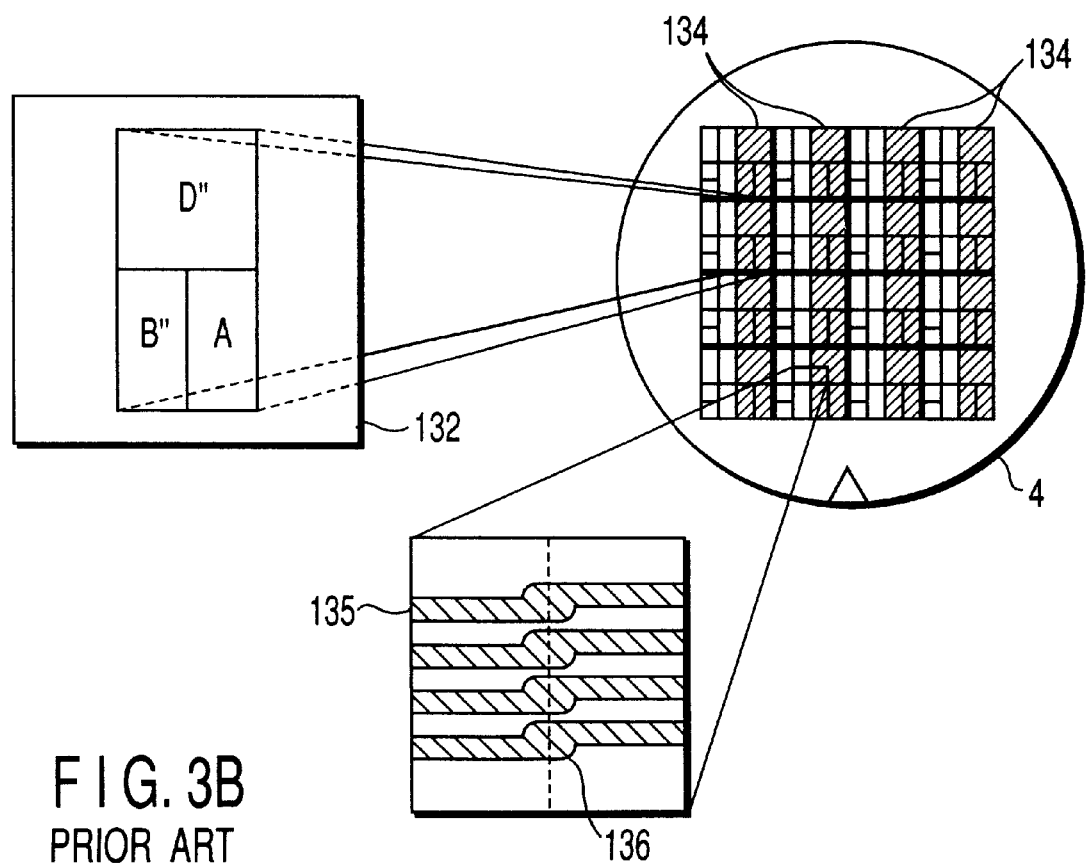
Figure 5:
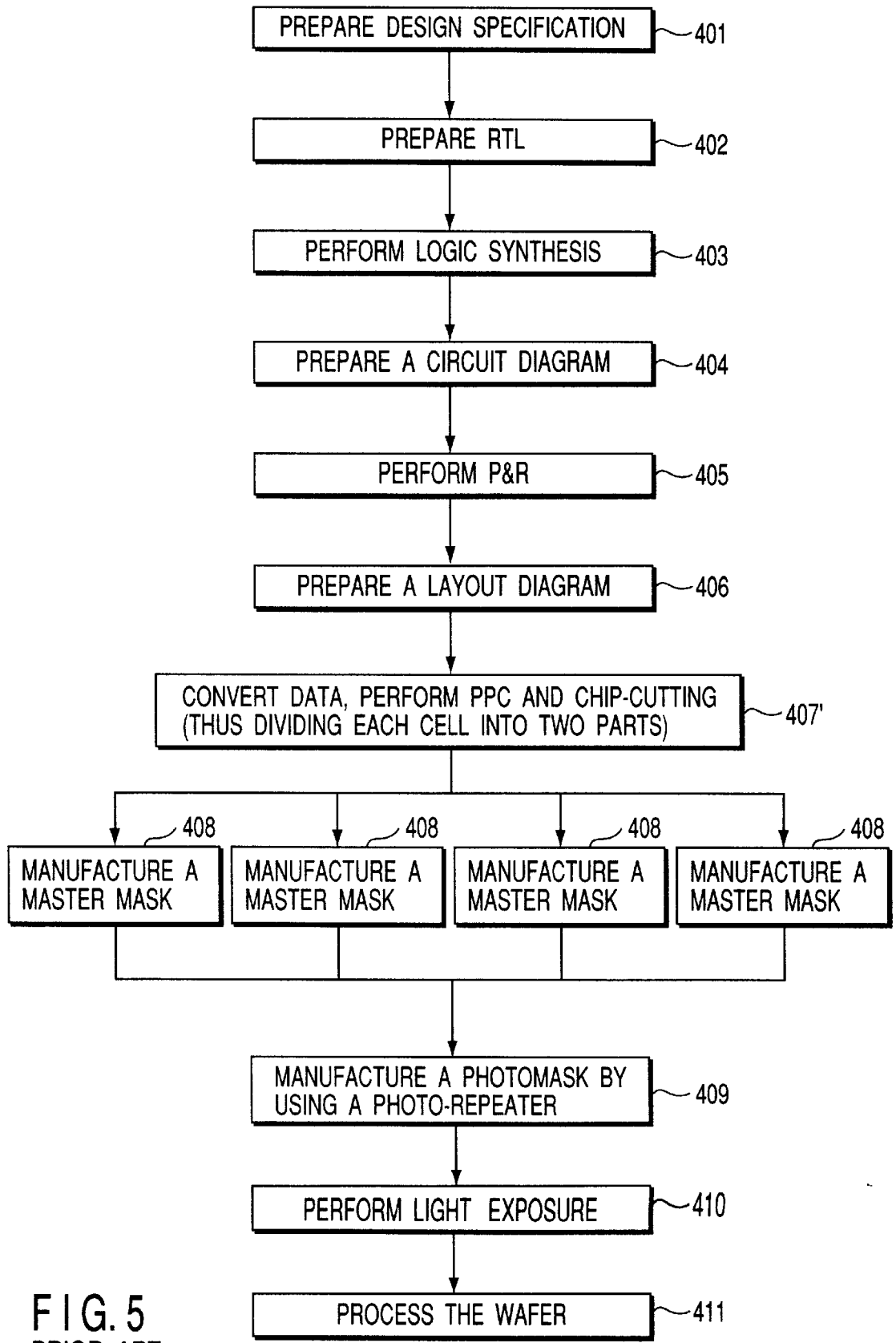
FIG. 5 is a flow chart explaining a conventional method of manufacturing a photomask, by using a plurality of master masks.
Figure 7A:
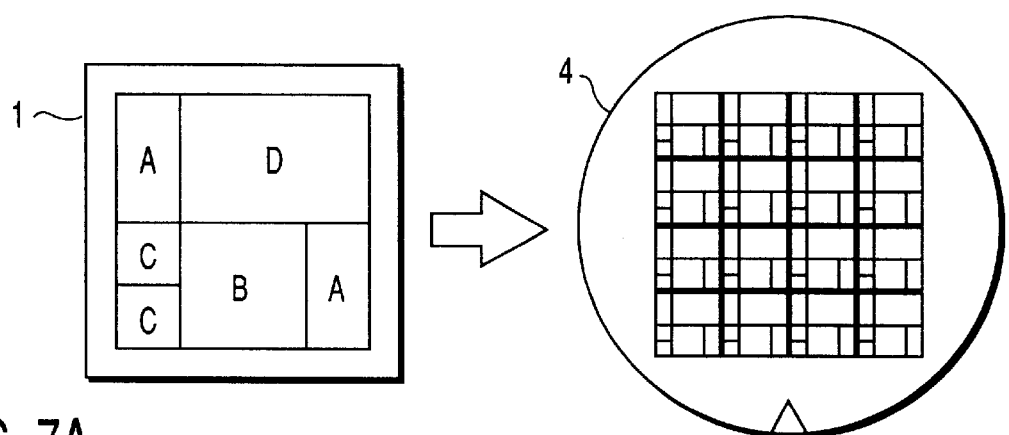
FIGS. 7A to 7C are diagrams showing the layouts of products made by a method of manufacturing a semiconductor device, according to the first embodiment of this invention.
Figure 7B:
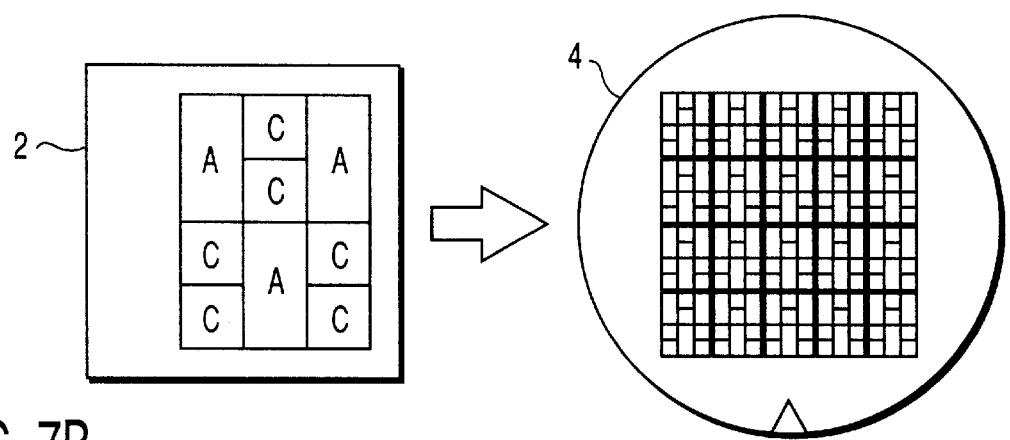
Figure 7C:
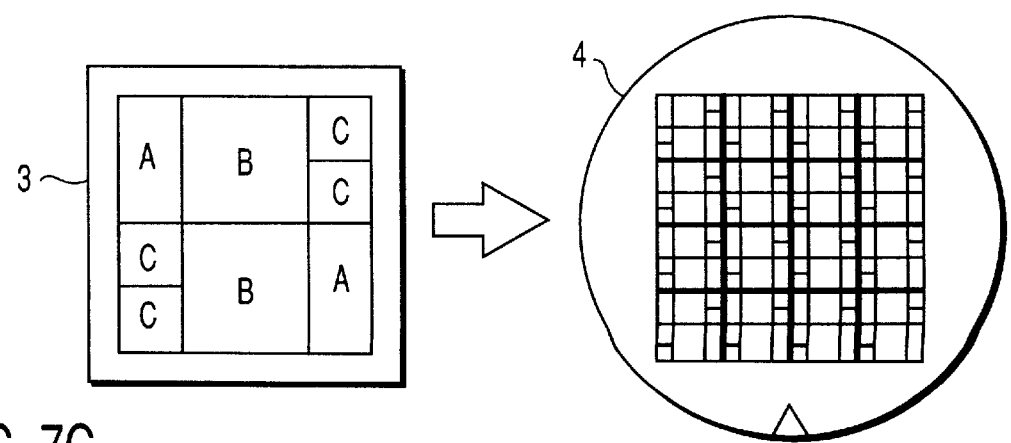

FIGS. 7A to 7C are diagrams showing the layouts of three products 1 to 3, respectively, which are made by the method according to the first embodiment. The product 1 is composed of macro cells A, a macro cell B, macro cells C and a macro cell D. The product 2 is composed of macro cells A and macro cells C, and the product 3 is composed of macro cells A, macro cells B and macro cells C. The macro cells constituting each of the products 1 to 3 are a function block each. Each of the products 1 to 3 is manufactured by transferring to a wafer 4 the image of a mask having the same cell pattern as the product, on the basis of data representing the layout of the function blocks.

Figure 8:
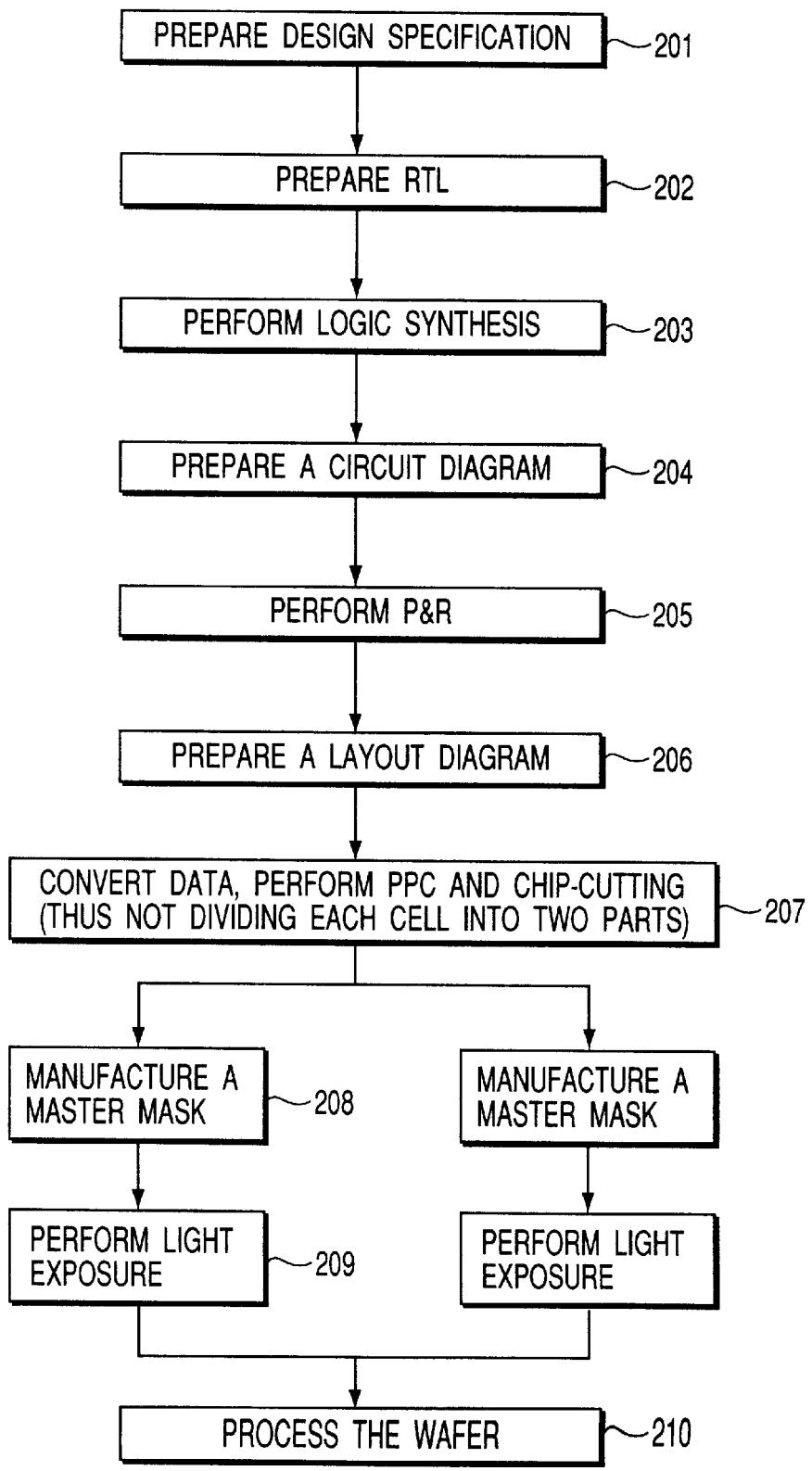
FIG. 8 is a flow chart explaining a method of manufacturing a semiconductor device, which is the first embodiment of this invention.

How the product 1, for example, is manufactured by the method according to the first embodiment will be explained, with reference to the flow chart of FIG. 8.

At first, the design specification is prepared in Step 201, in accordance with the requests made by the customer. In Step 202, a Register Transfer Level (RTL) is prepared on the basis of the design specification. The RTL is a kind of a Hardware Description Language (HDL). The HDL is a language or grammar for describing hardware and the function and operation of logic circuits. Various HDLs are available at various hierarchical levels corresponding to degrees of abstraction. One of these levels is the RTL. The RTL is a language describing the design specification which will be later converted to circuit diagrams. Thus, the RTL is equivalent to a detailed block diagram; it describes how data should be transferred between the components (blocks) of a circuit.

Next, in Steps 203 and 204, the RTL is converted to circuit diagrams by using a logic synthesis tool. The circuit diagrams are information representing the circuit configuration of the semiconductor device, which comprises AND circuits, OR circuits, NOR circuits and the like. In Steps 205 and 206, a Placement and Routing (P&R) tool is used, thereby preparing an actual layout diagram. Intellectual Property (IP) blocks, i.e., the function blocks of the circuit, are utilized to prepare the RTL.

Step 205 of using the P&R tool will be described below in detail.

In a layer below the wiring layer, e.g., a layer in which transistors are arranged, function units called "standard cells," "macro cells," "IP blocks" or the like are arranged. An example of a function block is a flip-flop. The data representing the actual layout of the function blocks is stored in the database provided in the P&R tool.

In accordance with the data stored in the database, the function blocks are automatically arranged by the placement function of the P&R tool. After the function blocks have been arranged (or replaced) in all layers below the wiring layer, wires are arranged (or routed) in the wiring layer by the routing function of the P&R tool in accordance with the circuit diagrams. The wires are laid out so that they may work in compliance with the function blocks arranged in the layers below the wiring layer. More specifically, the compliance is achieved via contacts of the various wires connected to one another. When all function blocks are replaced and all wires are thus routed, an actual layout diagram is completed. The actual layout diagram shows the pattern that will be transferred to a wafer. The data showing the actual layout diagram will be hereinafter referred to as "pattern data" of the semiconductor device.

Thus, the actual layout diagram for one chip is completed in Step 206. Then, in Step 207, the pattern data of the semiconductor device is subjected to Process Proximity Correction (PPC) performed by the use of data conversion software. The PPC is a step of correcting the deformation of a pattern caused by Process Proximity Effect (PPE). More precisely, PPC corrects the rounding of the corners of each pattern component and the shortening of the pattern component, both due to optical proximity effect. PPC also corrects the change in the width of pattern component which occur, due to micro-loading effect after the mask layer or the wafer has been etched.

Figure 9A:
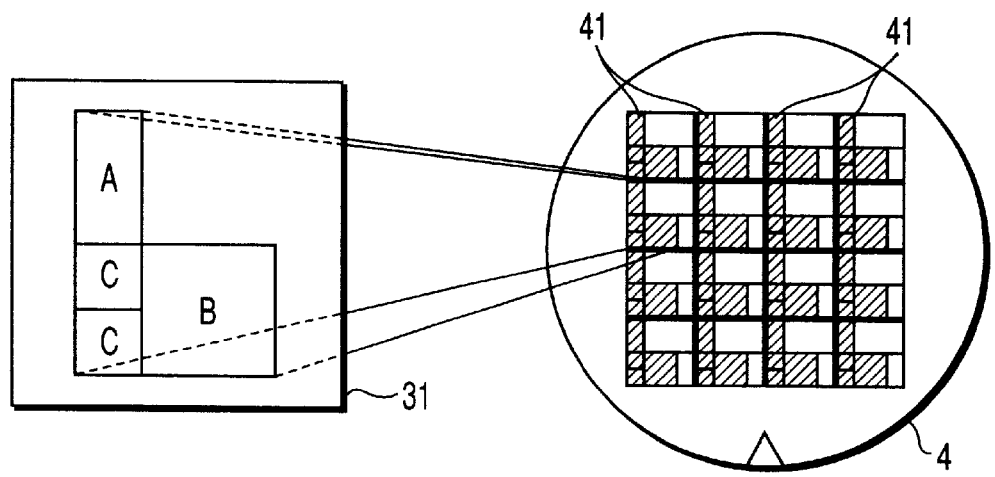
FIGS. 9A to 9C are diagrams for explaining the method according to the first embodiment of the invention.
Figure 9B:
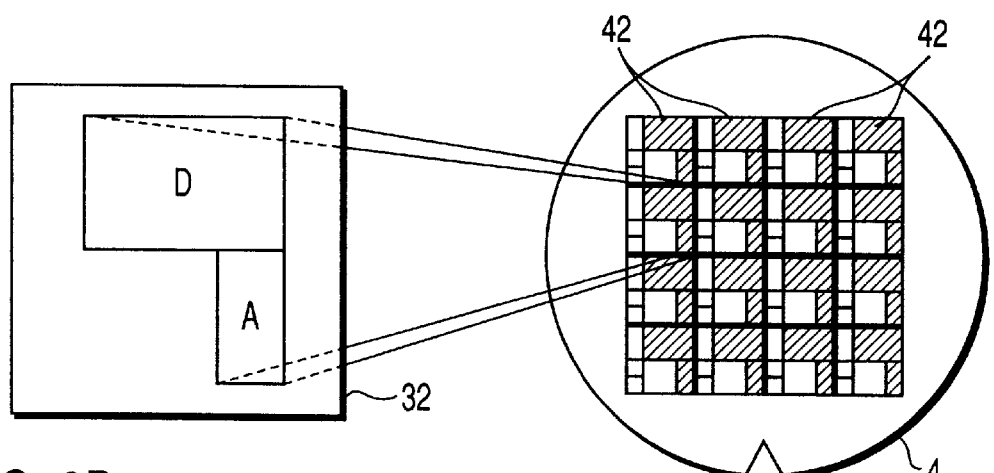
Figure 9C:
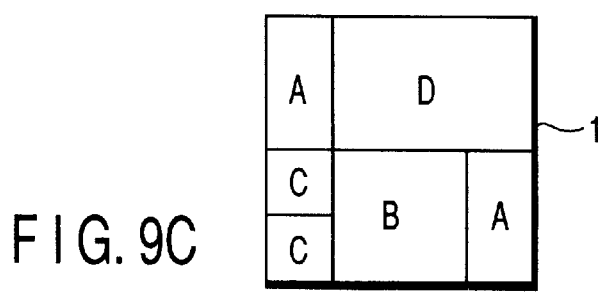

Further, in Step 207, the corrected pattern data is subjected to a chip-cutting process in Step 207, as will be described with reference to FIGS. 9A to 9C. FIG. 9C shows product 1 identical to the product shown in FIG. 7A. In Step 208, the mask for product 1 of FIG. 9C is divided into two masks 31 and 32, along the boundaries of the function blocks. As FIG. 9A shows, first mask 31 has one cell pattern A, one cell pattern B and two cell patterns C. As FIG. 9B shows, second mask 32 has one cell pattern A and one cell pattern D. All cell patterns A to D made in masks 31 and 32 are of the same size and shape as the corresponding cells provided in the product 1. None of the patterns A to D have been cut into smaller ones.

In Step 209, an exposure apparatus applies light to a wafer 4 through masks 31 and 32. An LSI pattern is thereby formed on the wafer in Step 210.

In the method according to the first embodiment of the invention, the mask for product 1 is divided into masks, along the boundaries of the function blocks as mentioned above. Therefore, the large cell patterns B and D remain undivided. Since no cell patterns are divided in the chip-cutting process, the components of any cell pattern are not cut into parts as in the conventional method in which the chip is cut along the center lines. Thus, the pattern components do not change size as does a pattern component composed of two or more parts jointed together.

In the first embodiment, after all function blocks of a chip are arranged and the pattern data of the chip is subjected to PPC, the chip-cutting process is performed. Masks 31 and 32 are prepared on the basis of the data acquired in the chip-cutting process. Hence, the present embodiment of this invention provides an advantage that the patterns at the right peripheral portion of the cell A made in mask 32 are corrected with consideration to the patterns at the left peripheral portion of cell D which should be located at the right side of cell pattern A on wafer 4.

Second Embodiment

A method of manufacturing a photomask, which is the second embodiment of the present invention, will be described with reference to FIG. 10 and FIGS. 11A to 11D. The second embodiment is a modification of the method of manufacturing a semiconductor device, which is the first embodiment of the invention. In the second embodiment, an LSI pattern is transferred to a mask blank, not to a wafer as in the first embodiment. The technical points identical to those of the first embodiment will not be described below in detail.

Figure 10:
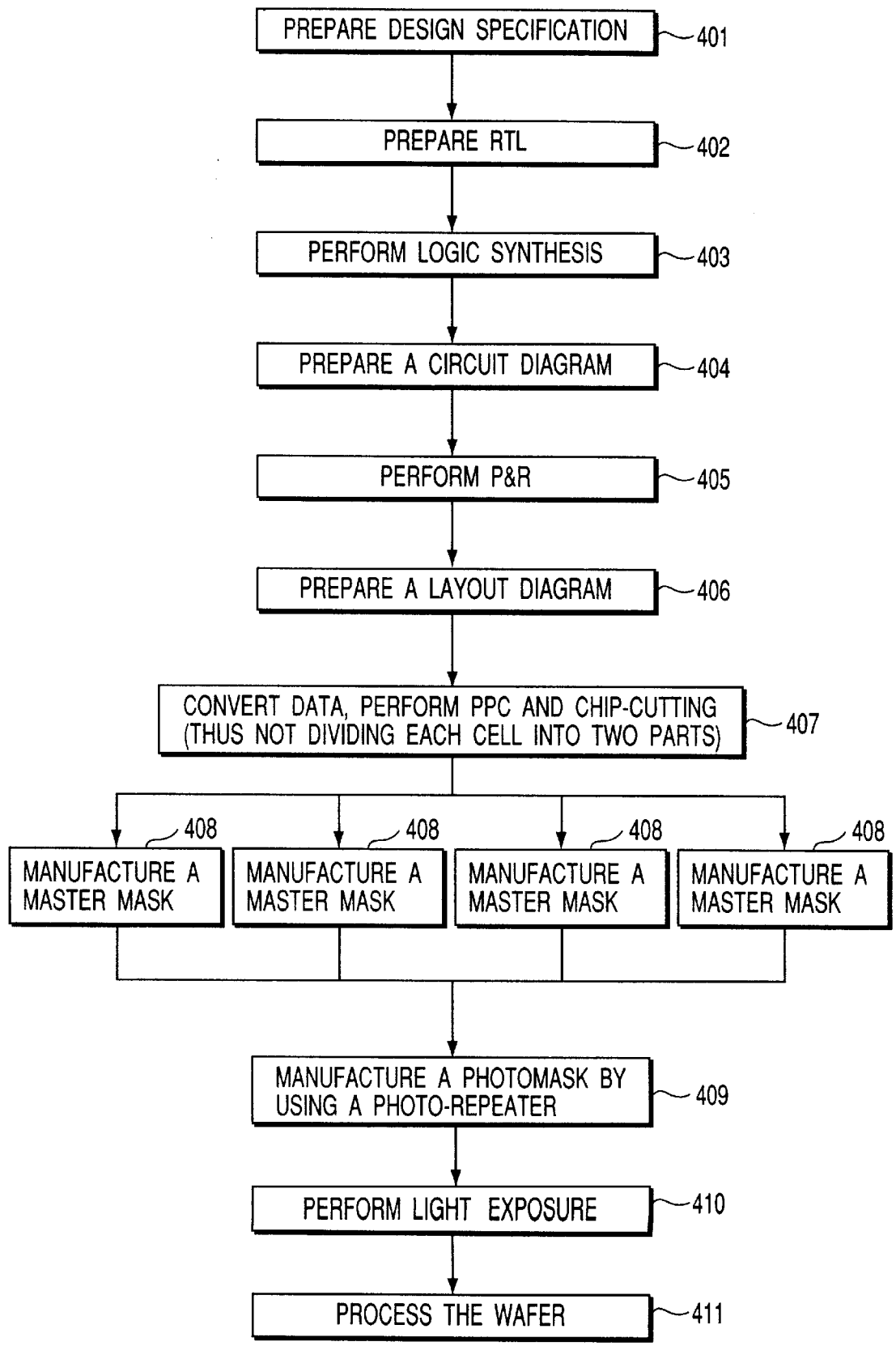
FIG. 10 is a flow chart explaining a method of manufacturing a semiconductor device, which is the first embodiment of the invention.

FIG. 10 is a flow chart explaining the method of manufacturing a photomask, according to the second embodiment. As can be seen from FIG. 10, the step of preparing the design specification (Step 401) to the step of forming master masks (Step 408) are identical to Step 201 to Step 208 of the first embodiment. The second embodiment differs in that photomasks are made by means of a photorepeater in Step S409. Using the photomasks made in Step S409, a wafer is processed in Steps 410 and 411.

In the first embodiment, light is applied to a wafer through master masks 31 and 32, thereby forming an LSI pattern on the wafer. In the second embodiment, photomasks are made by using master masks which have been cut from one mask, and an LSI pattern is formed by using these photomasks.

The second embodiment differs from the first embodiment with respect to PPC. In the first embodiment, PPC is performed to correct only the optical or process proximity effects that occur in the process of transferring the LSI pattern from the masks to the wafer. In the second embodiment, PPC is performed to correct not only the optical or process proximity effects that occur in the process of transferring the LSI pattern from the master masks to the photomasks, but also the optical or process proximity effects that occur in the process of transferring the LSI pattern from the photomasks to a wafer.

Figure 11A:
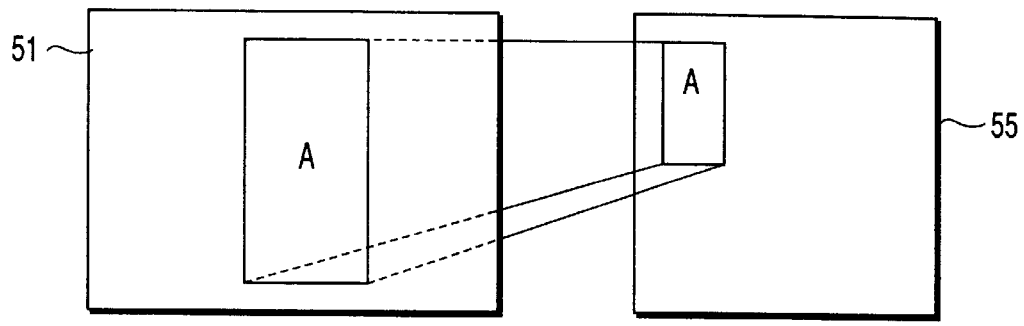
FIGS. 11A to 11D are diagrams for explaining a method of manufacturing a photomask, which is the second embodiment of this invention.
Figure 11B:
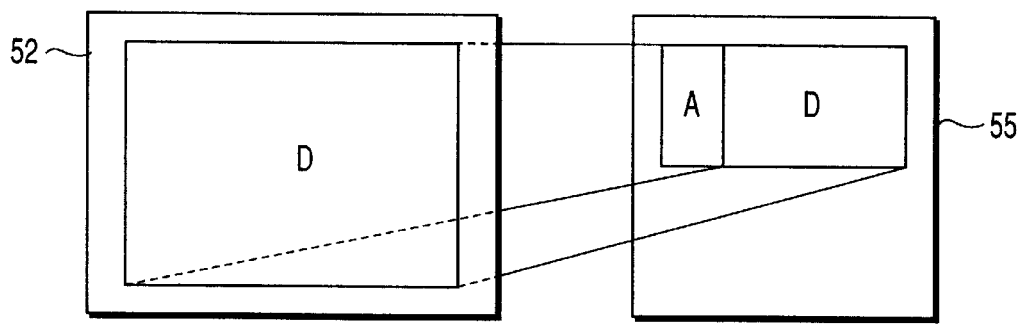
Figure 11C:
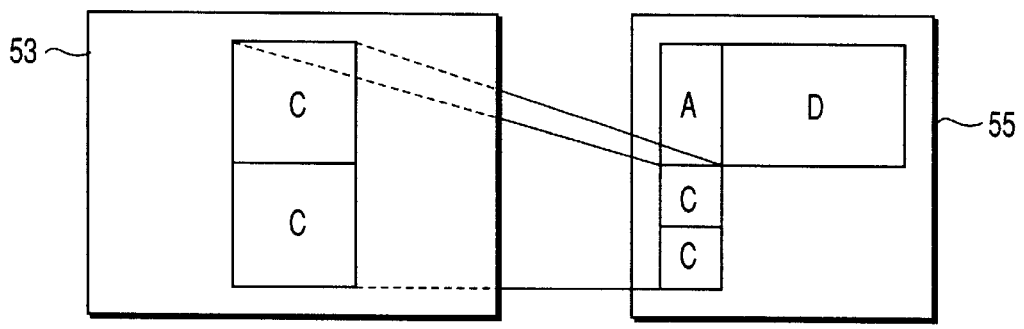
Figure 11D:
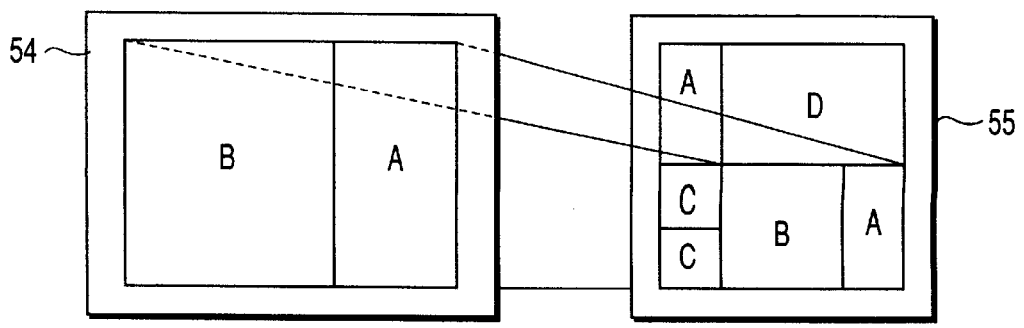

The process of forming the photomasks will be described with reference to FIGS. 11A to 11D. Shown in the left halves of FIGS. 11A to 11D are master masks 51 to 54. Shown in the right halves of FIGS. 11A to 11D is a photomask 55 being manufactured step by step. As shown in FIG. 11A, a cell pattern A is transferred from master mask 51 to photomask 55. Next, as FIG. 11B shows, a cell pattern D is transferred from master mask 52 to photomask 55 and arranged at one side of cell pattern A. Further, as FIG. 11C shows, two cell patterns C are transferred from master mask 53 to photomask 55. Finally, as FIG. 11D shows, cell patterns A and B are transferred from master mask 54 to photomask 55. As a result, photomask 55 has a pattern identical to the layout pattern of product 1.

Master masks 51 to 54 having the cell pattern A, cell pattern D, two cell pattern C, and cell patterns A and B, respectively, have been prepared by cutting a chip pattern along the boundaries of the cells (i.e., function blocks). Light is applied to a mask blank through master masks 51 to 54, thereby forming photomask 55 that has a pattern identical to the layout pattern of product 1.

Photomask 55 thus formed is used to transfer the layout pattern of product 1 to a wafer. Since each cell pattern for one function block is not divided in the chip-cutting process, its components are not cut into parts. Thus, there are no butting portions in the pattern formed on the wafer.

In the first and second embodiments described above, the chip pattern is cut along the boundaries of the function blocks. This chip-cutting process can be employed to make master masks each having a plurality of cell patterns or master masks each having only one cell pattern. The photomasks made in the first and second embodiments are designed to form an LSI pattern on a wafer. Nonetheless, they can be used to transfer the LSI pattern to other photomasks.

In the second embodiment, after all function blocks of a chip are arranged and the pattern data of the chip is subjected to PPC, the chip is cut along appropriate lines. Master masks 51 to 54 are prepared on the basis of the data acquired in the chip-cutting process. Hence, the present embodiment of this invention provides an advantage that the patterns at the right peripheral portion of cell A made in mask 32 is corrected with consideration to the patterns at the left peripheral portion of the cell D which should be located at the right side of cell pattern A on wafer 4.

Third Embodiment

Figure 12:
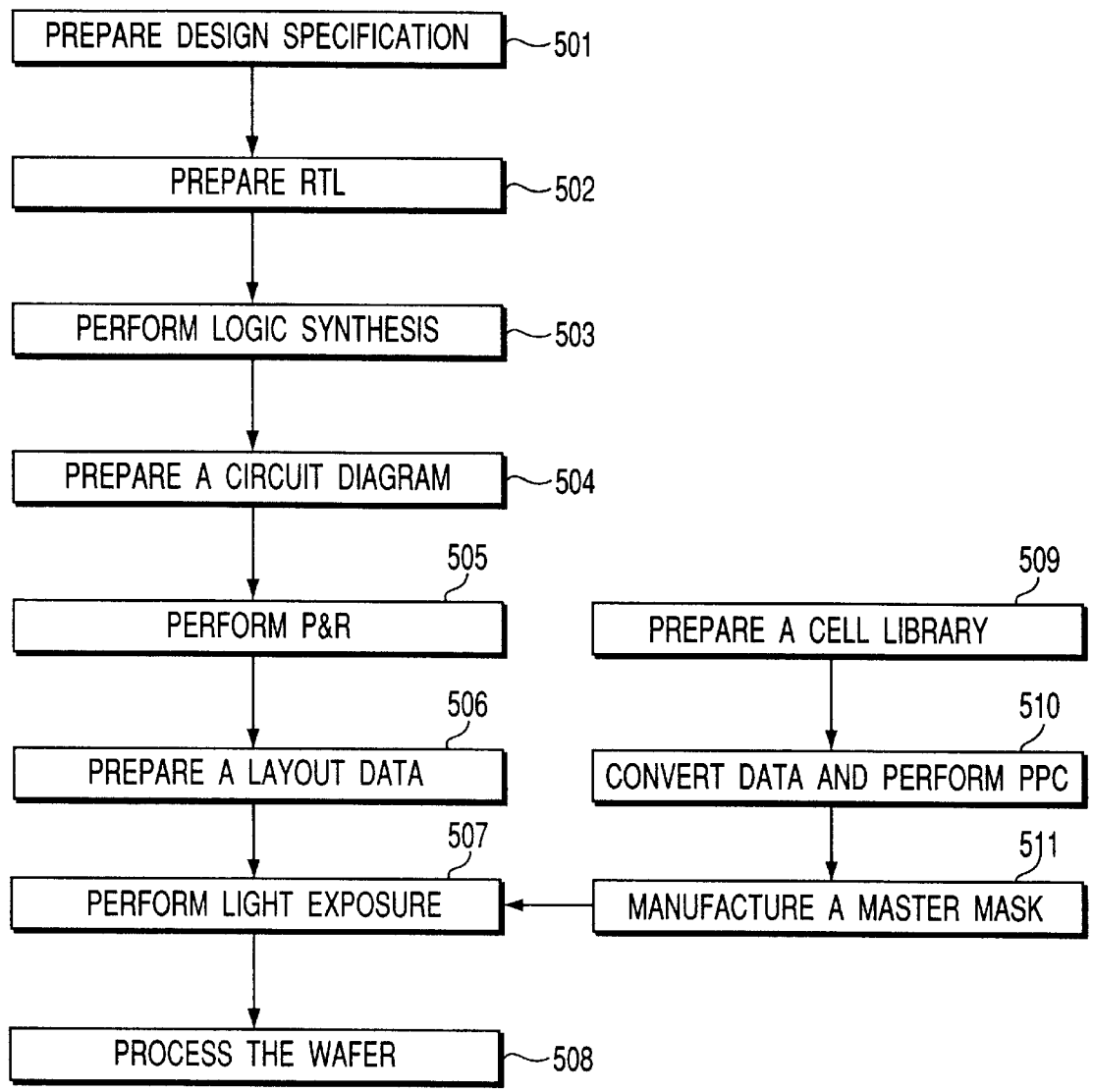
FIG. 12 is a flow chart for explaining a method of manufacturing a semiconductor device, which is the third embodiment of the invention.

A method of manufacturing a semiconductor device, which is the third embodiment of the present invention, will be described with reference to FIG. 12, FIGS. 13A to 13E, FIGS. 14A to 14C and FIGS. 15A to 15D. The third embodiment can shorten the time of forming masks. FIG. 12 is a flow chart explaining the method of manufacturing a semiconductor device (LSI), according to the third embodiment. As can be understood from FIG. 12, the step of preparing the design specification (Step 501) to the step of performing P&R (Step 504) are identical to Step 201 to Step 205 of the first embodiment, which are illustrated in FIG. 8.

The third embodiment differs from the first embodiment in that master mask is not prepared on the basis of the actual LSI layout diagram converted from the LSI circuit diagram by using placement and routing software. Rather, the master masks are prepared in accordance with a cell library. The cell library is information which represents all cell blocks (i.e., function blocks) incorporated in the product (LSI) and which does not contain cell layout data showing where the cell blocks should be arranged on a wafer.

Cell layout data is generated in Step 506. This data, which shows which cell pattern should be transferred to which part of the wafer, is input to an wafer exposure apparatus. In accordance with the cell layout data, the wafer exposure apparatus selects the cell patterns of the cell library drawn on a master mask, which should be transferred to a wafer. The other cell patterns of the cell library, which are not selected are blinded. Light is applied to the wafer through the selected cell patterns in Step 507, whereby desired cells are formed at appropriate positions on the wafer. The light exposure effected in the third embodiment will be described in greater detail, with reference to FIGS. 13A to 13E, FIGS. 14A to 14C and FIGS. 15A to 15D.

Figure 13A:
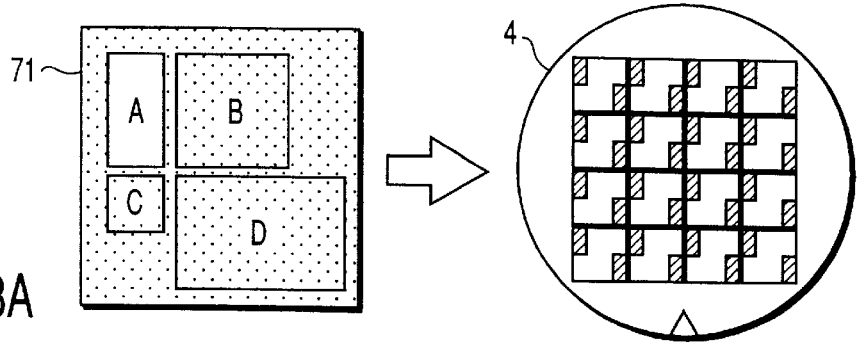
FIGS. 13A to 13E are diagrams for explaining the method according to the third embodiment of the invention.
Figure 13B:
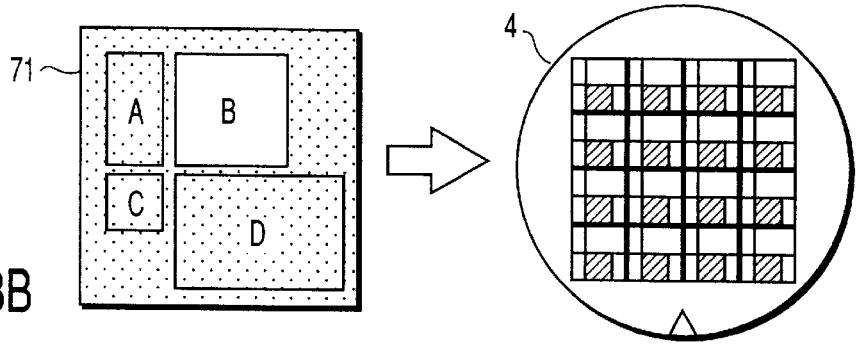
Figure 13C:
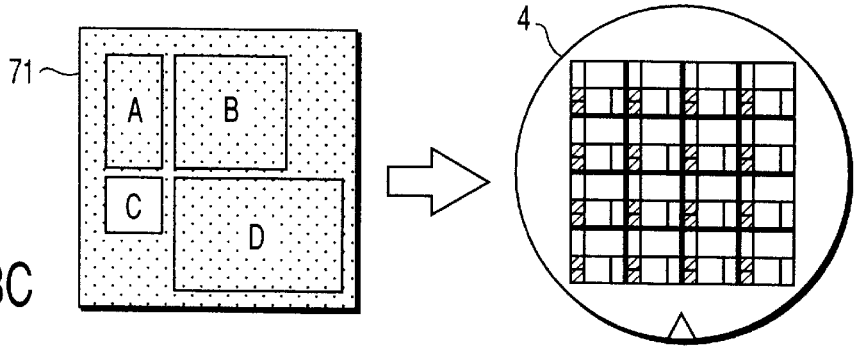
Figure 13D:
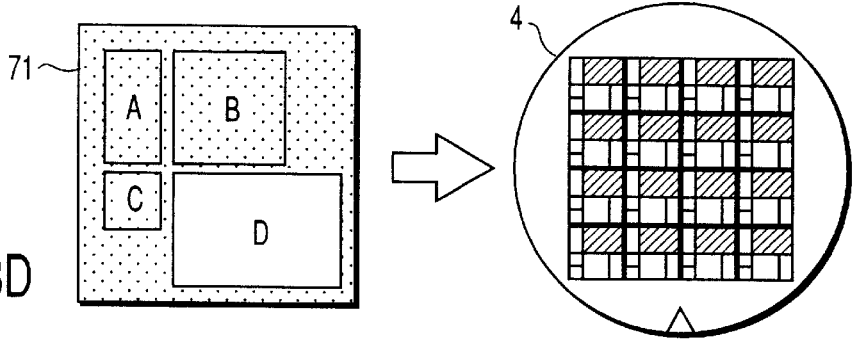
Figure 13E:
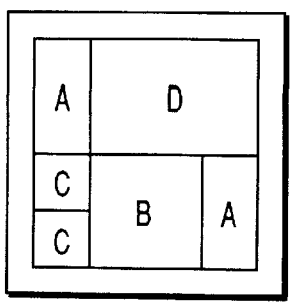
Figure 14A:
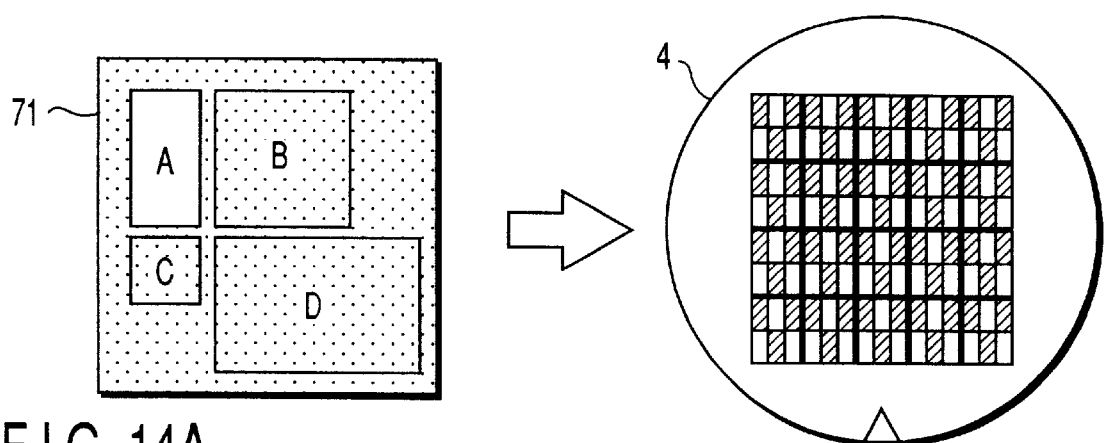
FIGS. 14A to 14C are other diagrams for explaining the method according to the third embodiment.
Figure 14B:
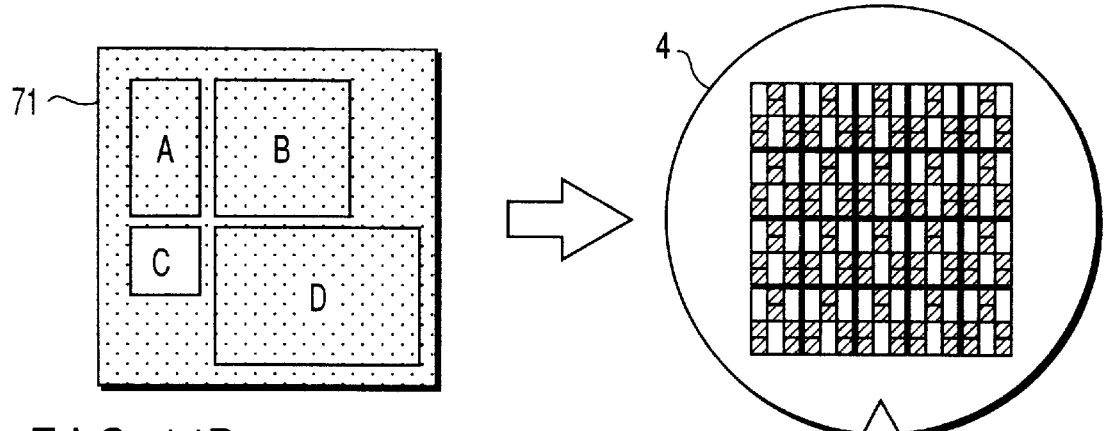
Figure 14C:
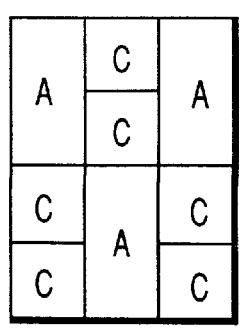

FIGS. 13A to 13E are diagrams for explaining the sequence of applying light to a wafer to manufacture product 1. FIGS. 14A to 14C are diagrams for explaining the sequence of applying light to a wafer to manufacture product 2. FIGS. 15A to 15D are diagrams for explaining the sequence of applying light to a wafer to manufacture product 3. The master mask 71 used in the exposure process has four cell patterns A to D of different sizes and shapes.

The sequence of applying light to manufacture product 1 will be explained with reference to FIGS. 13A to 13E. The wafer exposure apparatus applies light to the wafer in the following manner in accordance with the cell layout data generated by the placement and routing function of a P&R tool. First, cell pattern A of master mask 71 is selected as shown in FIG. 13A, while all other cell patterns B to D are blinded by the masking function of the wafer exposure apparatus. Light is applied to the wafer through cell pattern A, thereby forming a first cell A at, for example, the upper-left corner of the chip. The wafer stage is then moved, and light is applied again through cell pattern A of master mask 71, thereby forming a second cell A at the lower-right corner of the chip. Next, as shown in FIG. 13B, cell pattern B of master mask 71 is selected, while other cell patterns A, C and D are blinded, and light is applied to the wafer through the cell pattern B, forming cell B on the chip. Then, as illustrated in FIG. 13C, cell pattern C of the master mask 71 is selected, while other cell patterns A, B and D are blinded, and light is applied to the wafer through cell pattern C, forming a first cell C on the chip. The wafer stage is moved, and light is applied again through cell pattern C, thereby forming a second cell C below first cell C on the chip. Finally, as shown in FIG. 13D, cell pattern D of master mask 71 is selected, while other cell patterns A, B and C are blinded, and light is applied to the wafer through cell pattern D, forming a first cell D on the chip. As a result, the chip has two cells A, one cell B, two cell C and one cell D, as is illustrated in the magnified view of FIG. 13E.

As seen from FIGS. 13A to 13D, master mask 71 has cell patterns A to D spaced from one another and shield regions existing between the cell patterns A to D. In Step 510 shown in FIG. 12, accurate PPC is not performed to the opaque patterns at the peripheries of the cell pattern A to D, where proximity effect may be affected by the layout of the neighboring cell patterns. PPC is performed, broadening the width of the opaque patterns at the peripheries sufficiently. The opaque patterns must be broadened. For example, an optical proximity effect occurs in a wafer region about 1.5 to 2 m wide if the wafer is exposed to KrF excimer laser beams, and a proximity effect would occur in a wafer region about several microns to tens of microns wide if the wafer is subjected to a process such as etching.

Using master mask 71 thus prepared, cell patterns A, B, C and D are transferred to wafer 4 coated with a resist film. The cell patterns transferred to wafer 4 at the peripheral portions have broader dark regions than are desired, because the opaque patterns of master mask 71 at the peripheral portions are made wide. The width of each dark region is decreased by rewriting with an electron-beam drawing apparatus. Thereafter, the wafer is baked, developing the resist pattern on the wafer. The resist pattern formed by carrying out the drawing process has components of a desired width, also in the regions surrounding the cells. Before transferring cell patterns A, B, C and D sequentially to wafer 4, the cell patterns may be sufficiently spaced so that the resultant pattern may be free of influences of the proximity effect. Each cell can therefore be subjected to PPC, independently of any other cell, whichever cell is adjacent to it. In the case where the wafer is exposed to KrF excimer laser beams, the cells may be spaced at a distance of 1.5 to 2 m on the wafer.

The sequence of applying light to manufacture product 2 will be explained with reference to FIGS. 14A to 14C. A master mask 71 of the same type as used to make the product 1 is used to manufacture product 2. The wafer exposure apparatus applies light to the wafer in the following manner in accordance with the cell layout data generated by the placement and routing function of a P&R tool. First, cell pattern A of master mask 71 is selected as shown in FIG. 14A, while all other cell patterns B to D are blinded by the masking function of the wafer exposure apparatus. Light is applied three times to wafer 4 through cell pattern A, while moving the wafer stage, thus forming three A cells at different position on wafer 4. Next, as shown in FIG. 14B, cell pattern C of master mask 71 is selected, while the other cell patterns A, B and D are blinded. Light is applied six times to the wafer through cell pattern C, while moving the wafer stage, thereby forming six cells C on wafer 4. As a result, product 2 having two A cells and six C cells is manufactured, as is illustrated in the magnified view of FIG. 14C.

The sequence of applying light to manufacture the product 3 will be explained with reference to FIGS. 15A to 15D. A master mask 71 of the same type as used to make products 1 and 2 is used to manufacture product 3. The wafer exposure apparatus applies light to the wafer in the following manner in accordance with the cell layout data generated by the placement and routing function of a P&R tool. First, cell pattern A of master mask 71 is selected as shown in FIG. 15A, while all other cell patterns B to D are blinded by the masking function of the wafer exposure apparatus. Light is applied twice to a wafer 4 through cell pattern A, while moving the wafer stage, thus forming two A cells at different positions on wafer 4. Next, as shown in FIG. 15B, cell pattern B of master mask 71 is selected, while the other cell patterns A, C and D are blinded. Light is applied twice to the wafer through the cell pattern C, while moving the wafer stage, forming two B cells on wafer 4. Further, as shown in FIG. 15C, cell pattern C is selected, while the other cell patterns A, B and D are blinded. Light is applied four times to wafer 4, while moving the wafer stage, thereby forming four C cells on wafer 4. As a result, product 3 having two A cells, two B cells and four C cells is manufactured, as is shown in the magnified view of FIG. 15D.

In the manufacture of products 1 to 3, wafer 4 on the wafer stage is aligned in a specific manner with the wafer exposure apparatus when light is applied to the wafer for the first time. When light is applied to wafer 4 for the second time et seq., the wafer stage is moved a distance between the cell pattern transferred to wafer 4 and the next cell pattern to be transferred to wafer 4.

The light exposure method according to the third embodiment makes it possible to manufacture different products by using only one master mask that has been prepared in accordance with the cell library. In other words, one master masks is sufficient to manufacture various products; many master masks need not be prepared or used. This greatly reduces the man-hours required to manufacture the products, ultimately decreasing the manufacturing cost thereof.

In the third embodiment, only one master mask 71 is used which has been prepared on the basis of the cell library. Nonetheless, two or more master masks may be used in the present invention. If the cell library represents too many cell patterns to be formed in a single master mask, some cell patterns may be formed in one master mask and the remaining cell patterns may be formed on another master marks or other master masks.

The cell patterns formed in master mask 71 may be either patterns of primitive cells or patterns of macro cells. Since the same input/output sections of custom LSIs have the same pattern, a master mask having this pattern may be prepared and used.

Fourth Embodiment

Figure 16:
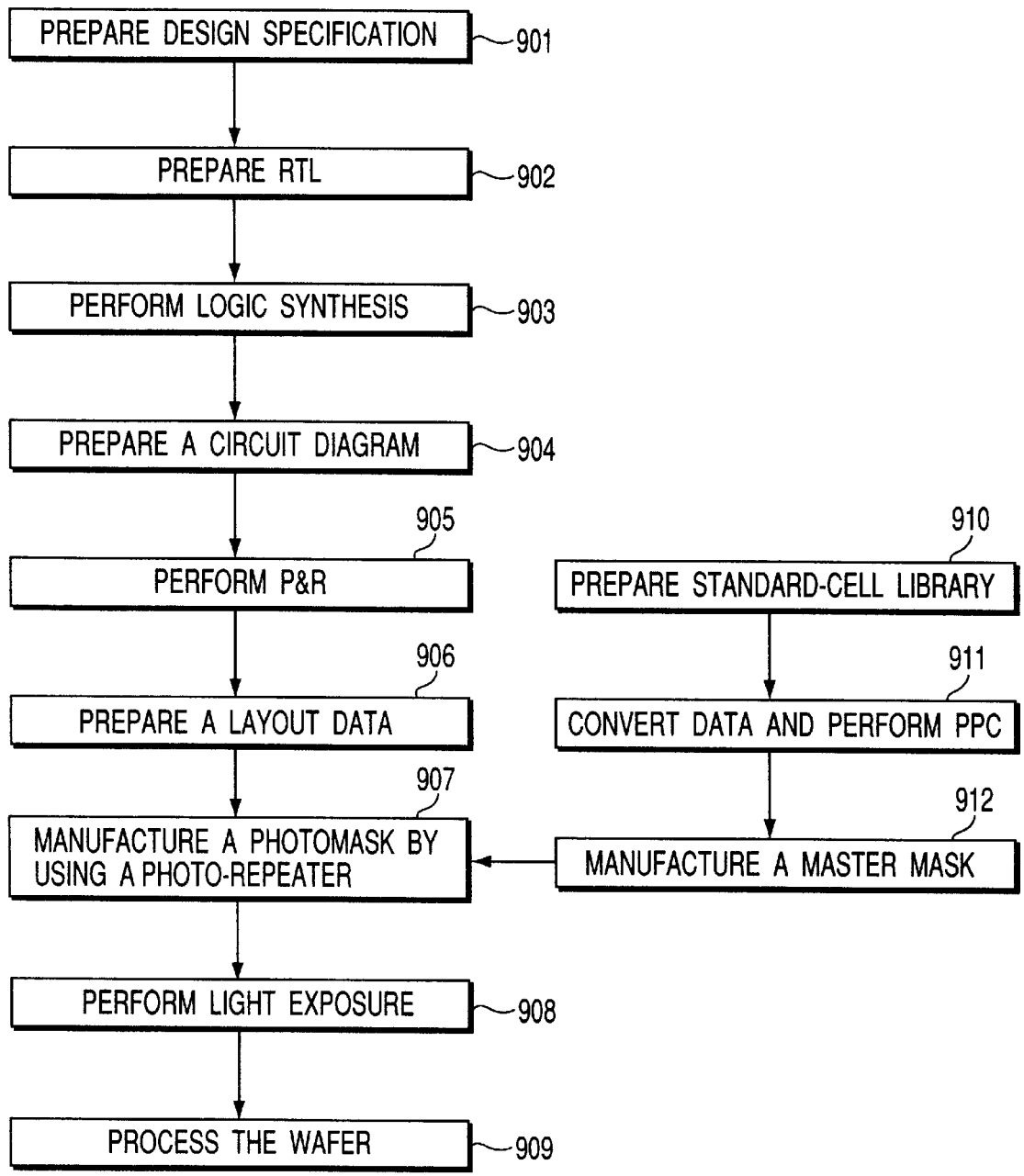
FIG. 16 is a flow chart for explaining a method of manufacturing a semiconductor device, which is the fourth embodiment of this invention.

A method of manufacturing a semiconductor device, according to the fourth embodiment of this invention, will be described with reference to FIG. 16 and FIGS. 17A to 17C. FIG. 16 is a flow chart for explaining this method according the fourth embodiment. The fourth embodiment is a modification of the third embodiment. It differs in that cell patterns are transferred to a photomask, not to a wafer as in the third embodiment.

As can be clear from FIG. 16, the steps 901 to 906, the last of which is the step of generating the cell layout data, are identical to Step 501 to Step 506 of the third embodiment (FIG. 12). In Steps 910 to 912, a master mask on the basis of the cell library, not on the basis of the LSI circuit diagram as in the second embodiment, by using the placement and routing software (P&R tool). The cell layout data is inputted from the placement and routing function of a P&R tool to a mask-forming exposure apparatus (i.e., photorepeater). The cell layout data shows where the cell blocks should be arranged on the photomask. In accordance with the cell layout data, the mask-forming exposure apparatus selects the cell patterns of the cell library drawn on a master mask, which should be transferred to the photomask. The other cell patterns of the cell library, not selected, are blinded. Light is applied to the wafer through the selected cell patterns, whereby desired cells are formed at appropriate positions on the photomask. The light exposure effected in the fourth embodiment will be described in detail, with reference to FIGS. 17A to 17C.

As seen from FIGS. 17A to 17C, the master mask 111 has four cell patterns A to D. The cell patterns A to D are spaced from one another and arranged as is specified by the cell library. First, the mask-forming exposure apparatus applies light twice through cell pattern A to photomask 112, while blinding the other cell patterns B, C and D as shown in FIG. 17A and moving the mask stage (not shown). Two A cells are thereby formed on photomask 112 as is illustrated in FIG. 17A. Next, the exposure apparatus applies light twice through cell pattern B to photomask 112, while blinding the other cell patterns A, C and D as shown in FIG. 17B and moving the mask stage. Two B cells are thereby formed on photomask 112 as shown in FIG. 17B. Then, the exposure apparatus applies light four times through cell pattern C to photomask 112, while blinding the other cell patterns A, B and D as shown in FIG. 17C and moving the mask stage. Four C cells are thereby formed on photomask 112 as shown in FIG. 17C. As a result, product 3 (photomask) having two A cells, two B cells and four C cells is manufactured. In similar manners, products 1 and 2 (photomasks) can be manufactured.

As seen from FIGS. 17A to 17D, master mask 111 has cell patterns A to D spaced from one another and shield regions existing between cell patterns A to D. In Step 911 shown in FIG. 16, accurate PPC is not performed to the opaque patterns at the peripheries of cell patterns A to D, where proximity effect may be affected by the layout of the neighboring cell patterns. PPC is performed, broadening the width of the opaque patterns sufficiently. The opaque patterns must be broadened. For example, optical proximity effect would occur in a wafer region about 1.5 to 2 m wide if the wafer is exposed to KrF excimer laser beams, and a proximity effect would in a wafer region about several microns to tens of microns wide if the wafer is subjected to a process such as etching.

Using master mask 111 thus prepared, light is applied to photomask 112 coated with a resist film, thus transferring cell patterns A, B and C to photomask 112 one after another, as described above. The cell patterns transferred to photomask 112 at the peripheral portions have broader dark regions than is desired, because the opaque patterns of master mask 111 at the peripheral portion are made wide. The width of each dark region is decreased by rewriting with an electron-beam drawing apparatus. Thereafter, photomask 112 is baked, whereby the resist pattern is developed on photomask 112. The resist pattern formed in the drawing process has components of a desired width, also in the regions surrounding the cells. Before transferring cell patterns A, B and C sequentially to photomask 112, the cell patterns may be spaced at a predetermined distance. Each cell can be subjected to PPC, independently of any other cell, whichever cell is adjacent to it. Here, the predetermined distance is M×L, where M is the magnification of the pattern on photomask 112 with respect to the pattern on a wafer and L is the area on the wafer which is influenced by proximity effect.

The light exposure method according to the fourth embodiment makes it possible to manufacture different products by using only one master mask that has been prepared in accordance with the cell library. In other words, one master mask is sufficient to manufacture various products; many master masks need not be prepared or used. This greatly reduces the man-hours required to manufacture the products, ultimately decreasing the manufacturing cost thereof.

In the fourth embodiment, only one master mask 111 is used. Two or more master masks may be used instead, in the present invention. The cell patterns formed in the master mask 111 may be either patterns of primitive cells or patterns of macro cells. Since the same input/output sections of custom LSIs have the same pattern, a master mask having this pattern may be prepared and used.

As has been described, each cell pattern for one function block is not divided in the chip-cutting process. Hence, its components are not cut into parts and the pattern formed on the wafer or photomask has no butting portions. The pattern components do not change in size as occurs when a pattern component composed of two or more parts are jointed together.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
    using a master mask having function-block patterns obtained from information representing the circuit configuration of the semiconductor device to be manufactured, and, selecting from the master mask, at least one of the function-block patterns which corresponds to a prescribed position on a wafer to be exposed to light; and
    transferring the selected function-block patterns sequentially to the wafer, thereby forming a desired pattern thereon by photolithography means.

2. A method according to claim 1, wherein the master mask has the function-block patterns arranged in accordance with pattern data obtained on the basis of information representing the circuit configuration of the semiconductor device, the pattern data of the semiconductor device is divided along boundaries of the function blocks, thereby preparing a plurality of master masks, and the master masks are sequentially transferred to the wafer, thereby forming a desired pattern on the wafer.

3. A method according to claim 1, wherein the master mask has function-block patterns arranged at given positions, some of the function-block patterns are selected from the master mask in accordance with pattern data obtained on the basis of information representing the circuit configuration of the semiconductor device, and the selected function-block patterns are sequentially transferred to predetermined positions on the wafer, thereby forming a desired pattern on the wafer.

4. A method according to claim 1, wherein the master mask has function-block patterns arranged at given positions and spaced apart from one another, some of the function-block patterns are selected in accordance with pattern data obtained on the basis of information representing the circuit configuration of the semiconductor device, and the selected function-block patterns are sequentially transferred so that the function-block patterns are spaced a predetermined distance from one another on the wafer, thereby forming a desired pattern on the wafer.

5. A method according to claim 4, wherein the predetermined distance is set so that the desired pattern is free of influence from proximity effects.

6. A method of manufacturing a photomask configured to transfer a desired pattern by photolithography, said method comprising the steps of:

using a master mask having function-block patterns obtained from information representing the circuit configuration of the semiconductor device to be manufactured, and selecting, from the master mask, at least one of the function-block patterns which corresponds to a prescribed position on the photomask to be exposed to light; and transferring the selected function-block sequentially to the photomask, thereby forming a desired pattern thereon by photolithography means.

7. A method according to claim 6, wherein the master mask has the function-block patterns arranged in accordance with pattern data obtained on the basis of information representing the circuit configuration of the semiconductor device, the pattern data of the semiconductor device is divided along boundaries of the function blocks, thereby preparing a plurality of master masks, and the master masks are sequentially transferred to the photomask, thereby forming a desired pattern on the photomask.

8. A method according to claim 6, wherein the master mask has function-block patterns arranged at given positions, some of the function block patterns are selected from the master mask in accordance with pattern data obtained on the basis of information representing the circuit configuration of the semiconductor device, and the selected function-block patterns are sequentially transferred to predetermined positions on the photomask, thereby forming a desired pattern on the photomask.

9. A method according to claim 6, wherein the master mask has function-block patterns arranged at given positions and spaced apart from one another, some of the function-block patterns are selected in accordance with pattern data obtained on the basis of information representing the circuit configuration of the semiconductor device, and the selected function-block patterns are sequentially transferred so that the function-block patterns are spaced a predetermined distance from one another, thereby forming a desired pattern on the photomask.

10. A method according to claim 9, wherein the predetermined distance is set so that the desired pattern is free of influence from proximity effects.

11. A method according to claim 9, wherein the predetermined distance, S, is given by the following equation:

$$S = M \times L$$

where M is a magnification of the pattern on the photomask and L is an area on the wafer, which is influenced by proximity effects and in which a desired pattern is to be transferred from the photomask by photolithography.

12. A master mask designed to transfer a pattern by photolithography means and having function-block patterns obtained from information representing the circuit configuration of the semiconductor device to be manufactured.

13. A master mask according to claim 12, wherein the function-block patterns are arranged in accordance with pattern data obtained on the basis of information representing the circuit configuration of the semiconductor device, and the pattern is divided along boundaries of the function blocks, thereby a part of the pattern data of the semiconductor device generated.

14. A master mask according to claim 12, wherein the function-block patterns correspond to different function blocks and are arranged at given positions.

15. A master mask according to claim 9, wherein the function-block patterns correspond to different function units of the semiconductor device, are arranged at given positions, and spaced apart from one another.

* * * * *

UNITED STATES PATENT AND TRADEMARK OFFICE
CERTIFICATE OF CORRECTION

PATENT NO.   : 6,340,542 B1                                              Page 1 of 1
DATED        : January 22, 2002
INVENTOR(S)  : Soichi Inoue et al.

It is certified that error appears in the above-identified patent and that said Letters Patent is hereby corrected as shown below:

<u>Column 14,</u>
Line 48, "claim 9", should read -- claim 12 --.

Signed and Sealed this

Tenth Day of September, 2002

*Attest:*

*Attesting Officer*

JAMES E. ROGAN
*Director of the United States Patent and Trademark Office*